(12) United States Patent
Bolz

(10) Patent No.: US 7,425,119 B2
(45) Date of Patent: Sep. 16, 2008

(54) ELECTRICAL CHARGE AIR COMPRESSOR PROVIDED WITH AN INTEGRATED AIR COOLING SYSTEM

(75) Inventor: Martin-Peter Bolz, Buehl (DE)

(73) Assignee: Robert Bosch GmbH (DE)

( * ) Notice: Subject to any disclaimer, the term of this patent is extended or adjusted under 35 U.S.C. 154(b) by 287 days.

(21) Appl. No.: 10/529,831

(22) PCT Filed: Jun. 11, 2003

(86) PCT No.: PCT/DE03/01931

§ 371 (c)(1),
(2), (4) Date: Mar. 30, 2005

(87) PCT Pub. No.: WO2004/031590

PCT Pub. Date: Apr. 15, 2004

(65) Prior Publication Data

US 2006/0081226 A1    Apr. 20, 2006

(30) Foreign Application Priority Data

Oct. 1, 2002  (DE)  ................................ 102 45 798

(51) Int. Cl.
| F04B 17/00 | (2006.01) |
| F04B 39/02 | (2006.01) |
| F02B 33/00 | (2006.01) |
| F02B 33/44 | (2006.01) |
| F02B 37/04 | (2006.01) |
| F02B 37/11 | (2006.01) |
| H02K 17/32 | (2006.01) |

(52) U.S. Cl. .................... 417/366; 417/371; 123/565; 123/559.1; 60/608

(58) Field of Classification Search ................. 123/565, 123/559.1; 60/607–609; 417/366, 371; F02B 39/10
See application file for complete search history.

(56) References Cited

U.S. PATENT DOCUMENTS

| 2,696,074 | A | * | 12/1954 | Dolza | .......................... 415/144 |
| 3,041,848 | A | * | 7/1962 | Greenwald | .................. 415/145 |
| 3,217,655 | A | * | 11/1965 | Sercy et al. | .................. 415/145 |
| 3,447,740 | A | * | 6/1969 | Friberg et al. | ............... 415/144 |
| 5,773,385 | A |   | 6/1998 | Katoh et al. | |

(Continued)

FOREIGN PATENT DOCUMENTS

DE   2117929   10/1972

(Continued)

*Primary Examiner*—Thai-Ba Trieu
(74) *Attorney, Agent, or Firm*—Michael Best & Friedrich LLP

(57) ABSTRACT

The invention relates to a device to compress combustion air, in particular a device to compress combustion air for a combustion engine of a motor vehicle, with a housing (12), with at least one compressor impeller (30) arranged in a compression area (28) of a first housing part (14), which is arranged in the flow direction between an air inlet (24) and an air outlet (43) of the housing (12), as well as with an electric motor (18) arranged in a second housing part (16) of the housing (12) to operate the compressor impeller (30). It is proposed in accordance with the invention that a flow channel (42) running in the circumferential direction of the first housing part (12) and connecting the compression space (28) with the air outlet (43) surrounds the electric motor (18) at least partially.

15 Claims, 3 Drawing Sheets

U.S. PATENT DOCUMENTS

| | | | |
|---|---|---|---|
| 5,904,471 A | | 5/1999 | Woollenweber et al. |
| 6,029,452 A | | 2/2000 | Halimi et al. |
| 6,102,672 A | | 8/2000 | Woollenweber et al. |
| 6,129,524 A | * | 10/2000 | Woollenweber et al. ..... 417/366 |
| 6,135,098 A | * | 10/2000 | Allen et al. .................. 123/565 |
| 6,474,066 B1 | * | 11/2002 | Lin .............................. 60/607 |
| 6,591,612 B2 | * | 7/2003 | Bolz et al. .................... 60/608 |

FOREIGN PATENT DOCUMENTS

| | | | |
|---|---|---|---|
| EP | 0650690 | | 5/1995 |
| EP | 1215378 | | 6/2002 |
| FR | 2815671 | | 4/2002 |
| JP | 61237830 A | * | 10/1986 |

* cited by examiner

ELECTRICAL CHARGE AIR COMPRESSOR PROVIDED WITH AN INTEGRATED AIR COOLING SYSTEM

BACKGROUND OF THE INVENTION

The invention relates to a device to compress combustion air, in particular an electrically operated charge-air compressor.

Increasing the power density of an internal combustion engine by compressing the air required for combusting the fuel by means of an exhaust-gas turbocharger is known. In this case, the exhaust-gas turbocharger features a turbine, which is arranged in the exhaust-gas flow of the combustion engine and which drives a compressor arranged in the charge-air feed of the internal combustion engine.

These types of exhaust-gas turbochargers have the known disadvantage of delayed and inadequate response characteristics at low rpms of the internal combustion engine ("turbocharger gap").

In order to improve the charge-air feed, especially in the range of lower rpms of the internal combustion engine, supporting the exhaust-gas turbocharger by means of an electric auxiliary drive is known. This can be achieved, for example, via an electric motor integrated into the exhaust-gas turbocharger. The electric motor then drives the shaft of the compressor of the exhaust-gas turbocharger at low rpms of the internal combustion engine. This kind of hybrid drive of the exhaust-gas turbocharger requires both a high rpm loading capacity of the electric motor as well as a high electric power requirement because of the high moment of inertia of the turbine of the exhaust-gas turbocharger that is necessarily heat-resistant and embodied of steel. In addition, the installation volume of such a exhaust-gas turbocharger is increased by the integration of the additional electric motor.

In order to avoid the disadvantages of the this type of hybrid drive, operating a separate, purely electrically operated auxiliary charger (electric auxiliary compressor) in the charge-air feed of an internal combustion engine in series with a conventional, turbine-operated exhaust-gas turbocharger is known from U.S. Pat. No. 6,029,452, for example. This has the great advantage that the electric auxiliary compressor that is used separately from the charge-air feed can be optimized for a short-term use in the lowest rpm range of the internal combustion engine. Typically, the electric auxiliary compressor is connected in series with the exhaust-gas turbocharger so that the achievable charge-air pressure is yielded as a product of the individual pressure values.

The short-term, very high-speed operation of the electric auxiliary compressor produces very high thermal stress to these system components. In addition to passively deriving the excess heat, also cooling the electric auxiliary compressor itself in operation via the inducted charge air is also known. For active air cooling, it is proposed in U.S. Pat. No. 5,904,471 that the inducted air flow first be directed along the motor housing or directly through the motor housing and then be fed to the compression space of the auxiliary compressor. The arrangement of the compressor impeller on the side of the driving motor opposite from the induction opening as well as guiding the airflow through the motor itself results in an increased flow resistance for the passive charge-air compressor. Such a system has the disadvantage of lower efficiency that can be achieved for the charge-air pressure.

In the range of high rpms of the internal combustion engine, which simultaneously leads to a high rpm of the exhaust-gas turbocharger and is therefore also connected with a high throughput of charge air alone due to the conveyance effect of the exhaust-gas turbocharger, a bypass solution is used to feed the charge air directly to the compressor of the exhaust-gas turbocharger while bypassing the auxiliary compressor that is now no longer needed. As a result, it is necessary for the electric auxiliary compressor to have, in its passive operation, the lowest possible flow resistance of the charge air inducted by the exhaust-gas turbocharger.

Integrating a bypass channel in the electric auxiliary compressor is known from U.S. Pat. No. 5,904,471. A flap valve used in U.S. Pat. No. 5,904,471, which diverts the charge-air flow into the bypass channel so that it is not directed via the compression space and the therein arranged compressor impeller of the electrically operated turbo-compressor. This type of flap-controlled bypass solution is not optimal, however, with respect to the flow-related requirements of the auxiliary compressor and is very costly and expensive for charge-air compression in terms of the requirements for assembly, size and cost of the overall system.

In particular, increased flow resistances are produced in the auxiliary compressor with a bypass solution in accordance with U.S. Pat. No. 5,904,471 since, among other things, corners and edges that produce turbulent flow conditions are present in the flow channel due to the embodied flap valve.

SUMMARY OF THE INVENTION

The objective of the invention is further developing an electric auxiliary compressor to the effect that it makes air cooling of its components with the lowest possible flow resistance possible in both active as well as passive operation.

The objective on which the invention is based is attained via a device to compress combustion air.

The electrically driven charge-air compressor in accordance with the invention avoids the disadvantages occurring in the prior art and makes it possible to operate an electric turbo-compressor in the charge-air feed of an internal combustion engine in series with an exhaust-gas turbocharger for example, whereby the auxiliary compressor in accordance with the invention is air cooled in active as well as passive operation. Air cooling is made possible in an advantageous manner while avoiding an increased flow resistance of the electric auxiliary compressor.

The device to compress combustion air in accordance with the invention features a housing with a first housing part, in which at least one compressor impeller is arranged in a compression space of the housing, which is arranged in the flow direction between an air inlet and an air outlet of the housing. In addition, the housing of the auxiliary compressor in accordance with the invention features a second housing part, in which an electric motor is arranged to operate the compressor impeller. Due to the fact that a flow channel running in the circumferential direction of the housing and connecting the compression space with the air outlet surrounds the electric motor at least partially, a thermal coupling is possible between the compressed charge-air flow and the electric motor driving the compressor.

Advantageous developments and exemplary embodiments of the invention are made possible.

The flow channel of the compressed charge air is embodied in such a way in the auxiliary compressor in accordance with the invention that there is a thermal coupling between the flow channel and the electric motor or between the flow channel and the second housing part that accommodates the electric motor.

The second housing part is advantageously formed at least partially of a heat conducting material, e.g., a metal.

A compact and very good heat-conducting embodiment of the auxiliary compressor in accordance with the invention is produced if the flow channel is essentially embodied in the second housing part itself. In the electric auxiliary compressor in accordance with the invention, the spiral-embodied connecting channel between the compression space of the compressor and the outlet opening of the compressor is "folded down" in the direction of the driving electric motor as compared to prior art embodiments. The hanging volute (compressor worm), i.e. a volute wound around the housing of the drive, therefore provides for an optimal cooling of the motor and electronics. Experience has shown that an especially favorable flow shaping of the air-conducting housing is identified by a straight, i.e. axial, inlet and a spiral outlet arranged on the circumference of the housing.

In a particularly advantageous exemplary embodiment of the auxiliary compressor in accordance with the invention, the flow channel (volute) is a part of the metal housing. The high air mass flow through the volute both in active as well as passive operation of the auxiliary compressor provides for optimal cooling of the metal body in which the driving motor for the compressor is accommodated. In addition to the driving electric motor, a compartment can also be embodied in the motor housing, which contains the electronic components of the motor or the compressor control that are to be cooled.

The motor housing advantageously has a smaller diameter than the inside diameter of the flow channel arranged on the circumference of the compressor housing. In this way, it is possible to allow the electric motor or the housing accommodating the electric motor to be enclosed at least partially in the axial direction without the construction volume of the compressor in accordance with the invention also being increased as well.

The very compact construction size of the auxiliary compressor in accordance with the invention is also the result of the fact that the flow channel is arranged on the high-pressure side of the compressor impeller. In particular, the flow channel (volute) can be arranged on the side of the compressor impeller facing away from the air inlet. This embodiment of the flow channel allows an effective air cooling of the compressor housing or the electric motor driving the compressor impeller to be achieved without a special flow diversion being required for the cooling effect. And what is more, the optimized flow guidance in the form of a spiral volute can also be used in an advantageous manner to cool the housing.

In order to keep the flow resistance of the auxiliary compressor in accordance with the invention as low as possible even the passive operating case, i.e. with the electric motor turned off, the compressor in accordance with the invention features a bypass channel, which connects the inlet channel of the compressor directly with the flow channel (volute). Because the flow channel can be connected with the inlet channel of the housing via the bypass channel, the invention-related shaping of the flow channel also makes a great cooling effect possible in passive operation. As a result, one and the same flow channel can be used advantageously in the auxiliary compressor in accordance with the invention to cool the components both in active as well as in passive operation. In the passive operating mode, which represents the predominant operating mode of the electric auxiliary compressor, it has only the task of allowing the airflow to pass through with the lowest possible flow resistance. In the process, the components can use the passing air to bring itself to the lowest possible operating temperature for the next use.

The compressor in accordance with the invention advantageous features means to close the bypass channel with an activated electric motor. A simple and reliable manner of closing the bypass channel consists of using the swirl of the air flowing radially out of the compressor impeller to close the bypass channel via, e.g., blades arranged in the diffuser of the compressor. In doing so, the bypass channel is closed both on its side facing the inlet channel of the compressor as well as on its side facing the flow channel (volute). Closing the flow channel on both sides advantageously permits air turbulence on the inlets of the bypass channel to be realized and therefore increased flow resistance in the active operation of the compressor.

The device in accordance with the invention also features means, in particular elastic means, to quickly and reliably open the bypass channel with a deactivated electric motor. Because of the large flow cross-section of the bypass channel, the auxiliary compressor in accordance with the invention constitutes only a very low flow resistance in a passive operating case. This makes favorable efficiency of the overall system of the charge-air feed or the combustion engine possible also in a passive operating case of the auxiliary compressor.

The invention to compress combustion air makes possible an electrically driven auxiliary compressor for the charge air of a motor vehicle, which makes efficient cooling possible, in particular cooling via the inducted charge air, without producing increased air resistance. Due to the fact that the air cooling is possible both in the active as well as passive operation of the electric charge-air compressor and it takes place advantageously through the same flow channel, the thermal stress can be kept low for such an electrical auxiliary compressor that is operated at high speed.

Additional advantages of the device in accordance with the invention can be found in the following drawings as well as in the associated description of an exemplary embodiment of a device in accordance with the invention to compress combustion air.

BRIEF DESCRIPTION OF THE DRAWINGS

Two exemplary embodiments of a device to compress combustion air are depicted in the drawings, and these exemplary embodiments are supposed to be explained in more detail in the following description. The figures in the drawings, the description thereof, as well as the claims aimed at this, contain numerous features in combination. A person skilled in the art will also observe these features individually and combine them into additional, meaningful combinations.

The drawings show.

DETAILED DESCRIPTION

Figure 1:
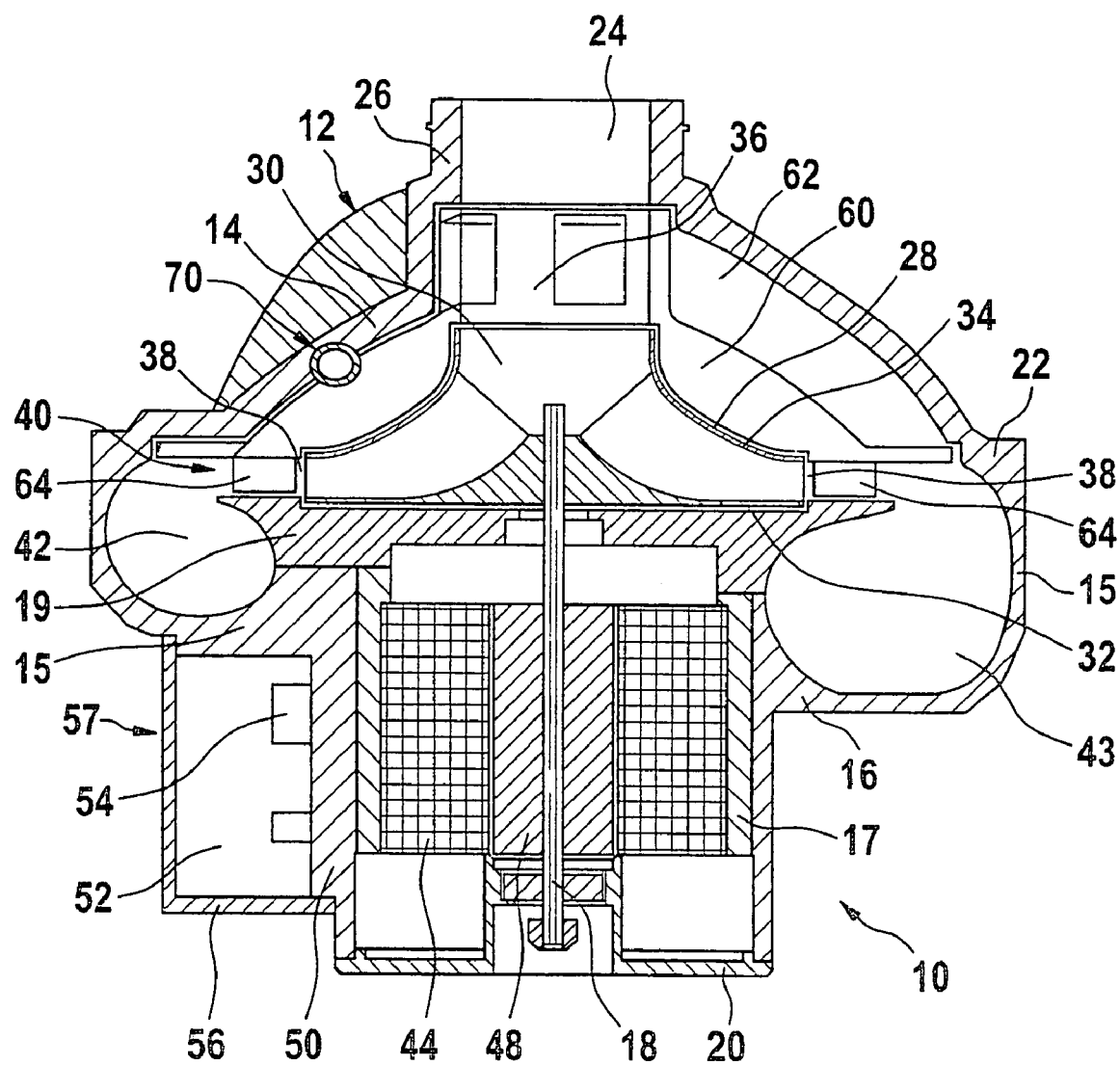
FIG. 1 A schematic representation of a cross-section through an electrically operated charge-air compressor in accordance with the invention.

FIG. 1 shows a schematic representation of a first exemplary embodiment of the device in accordance with the invention to compress combustion air. The compressor 10 features a housing 12, which is embodied as several pieces in the exemplary embodiment in FIG. 1. The housing of the compressor essentially includes a first housing part 14 for the actual compressor head 22 of the device (also called compressor part of the device in the following) and a second housing part 16, which surrounds the driving means for the compressor and, in the exemplary embodiment in FIG. 1, essentially includes an electric motor 18 driving the compressor along with associated electronic components. The second housing part 16 of the compressor in accordance with the exemplary embodiment in FIG. 1 is in itself constructed of three parts for manufacturing-related reasons. The housing part 16 includes the actual motor housing 17 of the driving electric motor 18, which is embodied as a pole pot or as a tube, a diffuser ring 19, which is arranged in the axial direction between the compressor head 22 and the motor housing 17 and a third housing part 15, which contains a compartment 52 for electronic components to trigger the compressor and a part of the flow channel of the compressor.

In addition the housing 12 features a base 20 closing the one housing part 16, which enables easy access to the motor part of the device and in addition also supports a bearing of the drive shaft of the compressor impeller.

The compressor head 22 of the compressor 10 is embodied as a radial compressor with axial induction. The first housing part 14 for the compressor head 22 has a bell-shaped or funnel-shaped design with an inlet channel 24, which is formed by an inlet connection piece 26 of the first housing part 14.

A compression space 28, in which a compressor impeller 30 is arranged, is embodied in the first housing part 14. The compressor impeller 30 is arranged concentrically to the inlet channel 24 of the first housing part 14 of the compressor 10. The compressor impeller 30 features a flat underside 32, which is facing the second housing part 16 of the compressor 10 and the diffuser ring 19 in particular. The upper side of the compressor impeller facing away from underside 32 of the compressor impeller 30 is provided in a manner that is known per se with compressor structures 34 in the form of three dimensionally embodied blades. A first flow channel 36 extends from the inlet channel 24 of the compressor 10 in the axial direction of the compressor into the compression space 28. The charge air inducted through the first flow channel 36 when the compressor is in operation is accelerated via the compressor impeller 30 and pressed radially to the outside. On its radial ends 38, the compression space 28 turns into a radial diffuser 40. The radial diffuser 40 in turn terminates in a flow channel 42, which, as a worm, widens continuously at the circumference of the housing 12 and acts as a collector for the compressed charge air. At the point at which the spiral flow channel 42 (volute) hits its beginning in the circumferential direction of the compressor, the flow channel 42 moves tangentially away from the housing 12 of the compressor. The radial diffuser 40 also ends tangentially in the flow channel 42. The diffuser ring 19, which therefore conveys the air from the compressor impeller into the flow channel 42 on its upper side facing the compressor impeller 30, is simultaneously cooled in the process by this air. In this connection, it forms, together with the underside of a control hood 60, a ring diffuser for a bypass channel of the compressor and this ring diffuser delays the airflow and therefore builds up pressure. Beyond this, the diffuser ring 19 serves at the same time as an end shield for the drive shaft of the electric motor 18.

In the exemplary embodiment of the compressor in accordance with the invention shown in FIG. 1, the part of the flow channel 42 (shown in the upper area of the drawing, i.e. facing the compressor head 22) is formed by the first housing part 14 of the compressor and the diffuser ring 19 of the housing 16 so that the diffuser ring 19 can also be cooled by the air in the flow channel 42.

In the device in accordance with the invention, the flow channel 42 (volute) is folded down in the axial direction and therefore aligned in the direction of the second housing part 16 of the electric motor 18. (Normally, in the case of corresponding prior art compressors, the volute is adjacent above a radial diffuser, but pointed towards the induction side.) The flow channel 42 in accordance with the exemplary embodiment in FIG. 1 is embodied in the second housing part 16 of the compressor 10, which is adjacent in the axial direction to the compressor impeller. The second housing part 16, which encloses the electric motor 18 driving the compressor, consists advantageously of a good heat-conducting material. In particular, this housing can be manufactured of a metal, e.g., aluminum. This housing part includes the flow channel 42 and a support 52 for an electronic components 54 of the drive system. In the process, the air flowing by in the flow channel 42 cools, for one, the electric motor 18 via the diffuser ring 19 and secondly also the electronic components 54 in the electronics compartment 54.

The flow channel 42 of the compressor can be embodied in various cross-sectional shapes. A cross-section that is approximately elliptical is advantageous. There is only a small difference in the sizes of the semiaxis of the elliptical cross-sectional shape in the exemplary embodiment depicted in FIG. 1. The ellipticity can be more pronounced in other exemplary embodiments.

Thus, it is also possible for example to embody and arranged the flow channel 42 in such a way that the large semiaxis of the ellipse inscribing the channel runs parallel to the drive shaft of the compressor. It is possible in this way to cool the motor housing 17 over a large surface via the airflow of the flow channel 42. However, the compressor in accordance with the invention is not limited to the use of an elliptical cross-sectional profile for the flow channel 42. Circular or other cross-sectional shapes are also possible.

The driving motor 18, which features a stator 44 as well as a rotor 48 connected to a drive shaft 46, is embodied in such a way that the motor has a smaller diameter than the inside diameter of the flow channel 42. In this way, it is possible for the flow channel 42 that is folded down in the direction of the electric motor 18 and running in the circumferential direction of the housing 12 to enclose the electric motor completely in the circumferential direction and to surround it at least partially in the axial direction.

The lower part of the flow channel 42 facing the electric motor 18 is worked out in the housing part 15 or 19. For manufacturing-related reasons, the housing 16 is embodied of several parts. The housing part 15 also includes the support 52 for the electronic components for the motor triggering. The high air mass flow in the flow channel 42 provides for optimal cooling of the metal body 50 of the housing part 15. The good thermal conductivity of the metal therefore provides for good cooling of the electronics compartment 54, which is embodied in the second housing part 15. In addition, the driving motor 18 with its housing 17, which is enclosed in the radial direction by the housing part 15, is also cooled by the metal body 50.

Electronic components 54 of the power electronics are attached advantageously to trigger the electric motor 18 or to operate the compressor 10 in thermal contact with the metal body 50. In this case, the electronic components and particularly the power semiconductors generating high power dissipation can be fastened directly to the housing part 15 with or even without heat conducting means. In this way, it possible to realize good thermal transmission, i.e. a high heat flow from the electronic components 54 into the air that is located in the flow channel 42. The electronics compartment 54 has a cover 56, which if need be can provide for corresponding openings in its outer side 57 for additional heat exchange with the environment. In addition, as already described, the housing part 17 of the electric motor is strongly coupled thermally to the diffuser ring 19 and the housing part 15 so that the heat produced by the motor can be dissipated well in this way.

Figure 2:
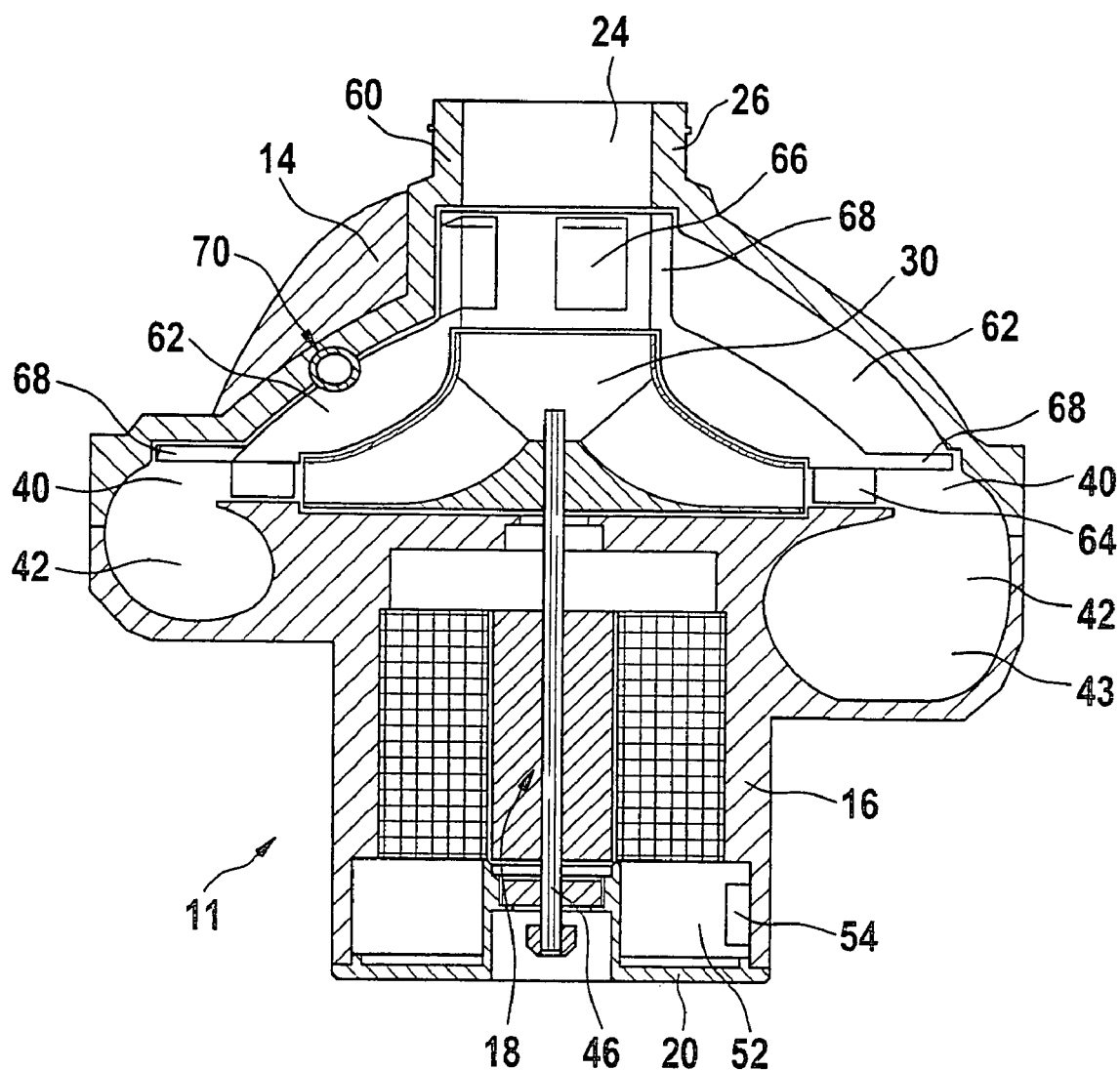
FIG. 2 A cross-section through an alternative embodiment of a charge-air compressor in accordance with the invention with a closed bypass channel.
Figure 3:
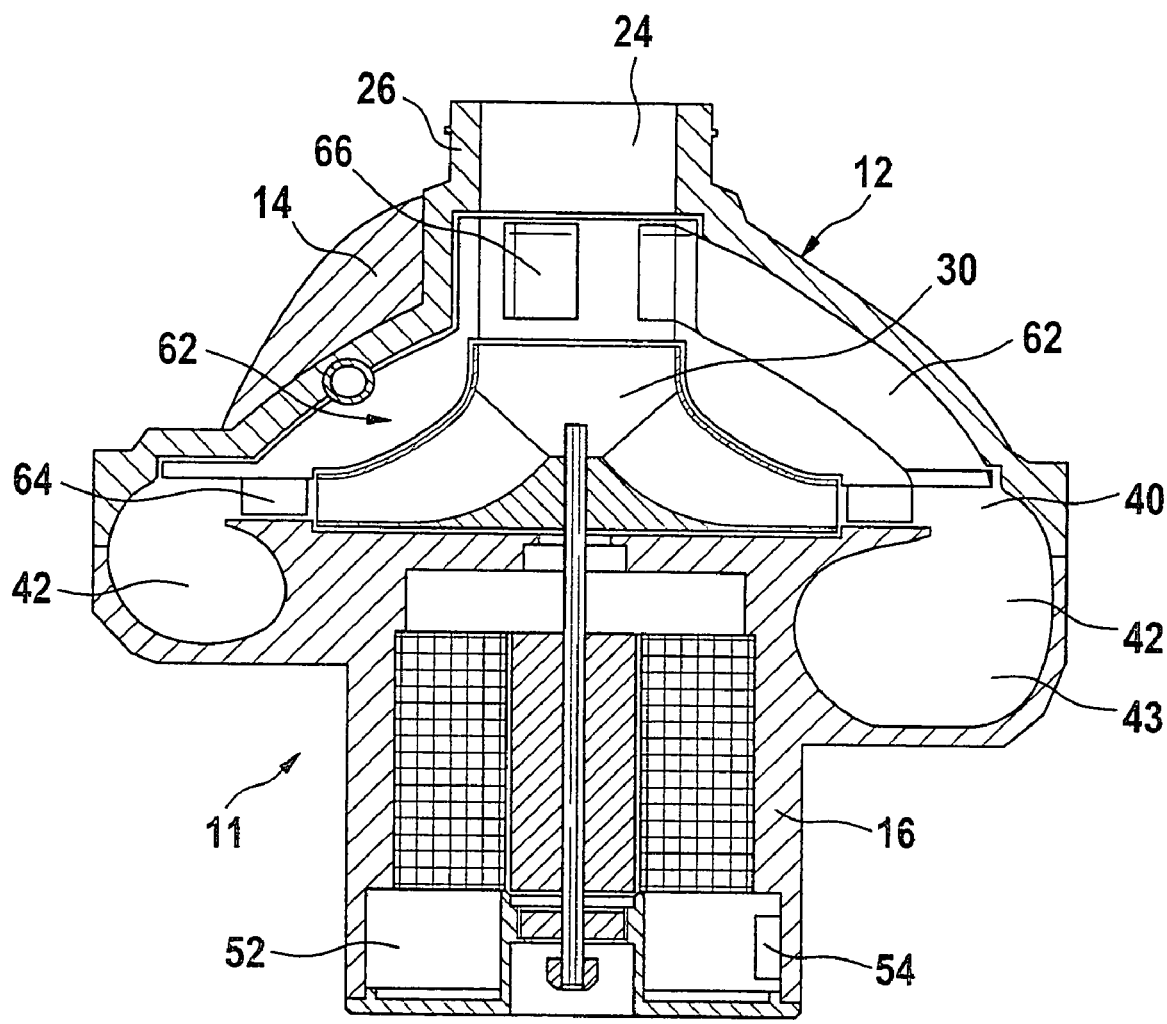
FIG. 3 A cross-section through the charge-air compressor in accordance with FIG. 2 with an opened bypass channel.

FIGS. 2 and 3 show a compressor 11 that has only been slightly modified with respect to the driving motor. When the air compressor 10 or 11 is in active operation, the electric motor 18 drives the compressor impeller 30 in the compression space 28 via the drive shaft 46. In the exemplary embodiment in FIGS. 2 and 3, the housing 16 of the compressor 11 is embodied as a single piece. Even though this has manufacturing-related disadvantages, it provides for optimal cooling of both the motor 18 as well as the electronic components 54 via the air of the flow channel 42.

The adaptation to various mass flows in the active or passive state of the compressor 10 or 11 is accomplished by means of a control hood 60, which is arranged in a bell-shaped manner in the first housing part 14 between the inlet connection piece 26 and the compression space 28 of the compressor. A bypass channel 62 branches off of the inlet connection piece 26 in an almost tangential direction and this bypass channel makes a connection possible between the inlet channel 24 and the flow channel 42. The bypass channel 62 discharges in this case into the outlet circumference of the radial diffuser 40, which at this point turns directly into the flow channel 42.

Blades 64, which are in mechanical working connection with the control hood 60, are arranged in the radial diffuser 40. When the compressor 10 or 11 is in an active state, the swirl of the compressed air flowing radially from the compressor impeller 30 into the radial diffuser 40 drives the control hood 60 in the direction of rotation of the compressor impeller by means of the blades 64 in the diffuser. The control hood 60 is positioned in the housing 14 in such a way that it rotates around a defined angle via the air swirl and in doing so closes the bypass channel 62 due to the twisting of the windows 66 or other corresponding closing elements 68. In this case, the inducted compression air reaches from the inlet connection piece 26 directly into the compression space 28, in that it is accelerated via the compressor impeller 30 and thereby compressed. The air is transmitted via the flow channel 42 in the direction of the outlet channel 43. In this connection, in the case of the compressor 10 or 11 in accordance with the invention, both sides of the bypass channel 62, i.e. both the beginning of the bypass channel 62 facing the inlet channel 24 as well as the end of the bypass channel 62 facing the radial diffuser 40, are closed via the closing elements 68 or by twisting the windows 66 in the control hood 60. It is possible in this way to avoid the formation of whirling that could form, e.g. at the opening of the bypass channel to the radial diffuser. Such formation of whirling represents a high flow resistance and would have a disadvantageous effect on the favorable and therefore low-loss flow that is striven for.

The control hood 60 is positioned in the housing 14 in such a way that it rotates around a defined angle via the air swirl acting upon the blades 64 and in doing so tenses a spring device 70 situated between the control hood 60 and housing 14.

If the electric drive 18 of the compressor 10 or 11 is turned off, the spring device 70 provides for a restoring moment, which rotates the control hood 60 back into its initial position (shown in FIG. 3) and thereby removes the closing elements 68 in front of the ends of the bypass channel 62 and opens the bypass channel.

FIG. 3 shows the device in accordance with the invention with an opened bypass channel 62. The compressor air, which is inducted through the connected-in-series exhaust-gas turbocharger for example, reaches the control hood 60 of the compressor in accordance with the invention via the inlet channel 24 and the first flow channel 36 and from there via the window elements 66 into the now opened bypass channel 62. Because of the large flow cross-section in the inlet channel 24, the window 66 as well as in the bypass channel 62, the air flowing through the passive auxiliary compressor experiences only a low flow resistance and in turn reaches the flow channel 42 almost unimpeded and from there the outlet 43 of the compressor 10 or 11. On its way through the flow channel 42, the inducted air enables efficient cooling in particular of the second housing part 16 with the driving motor 18 that is arranged therein. The compressor 10 or 11 can use the passing air in this passive operating mode to bring itself to the lowest possible operating temperature for the next use.

With the described device, it is advantageously possible to realize cooling of both the driving electric motor as well as the associated electronics of an electrically operated auxiliary compressor with the aid of the induction air without having to do without the flow-related optimal shaping of the flow of the inducted charge air in the process. Favorable and therefore low-loss flows can be embodied in both operating modes with this device, which in any case produces a more favorable efficiency of the combustion engine with associated charge-air feed. Due to the arrangement of a flow-related optimal flow channel in accordance with the invention, it is possible to realize optimal cooling of the electronic components of the device while maintaining the largest possible flow cross-sections, even when using a bypass channel in passive operation of the compressor in accordance with the invention.

The electrically operated charge-air compressor in accordance with the invention is not restricted to the exemplary embodiment presented in the drawings. In particular, the device is not restricted to the use of only a single compressor impeller.

The charger-air compressor in accordance with the invention is not restricted to the use of a control hood for the integrated bypass channel.

The invention claimed is:

1. A device to compress combustion air for a combustion engine of a motor vehicle, with a housing (12), with at least one compressor impeller (30) arranged in a compression area (28) of a first housing part (14), which is arranged in the flow direction between an air inlet (24) and an air outlet (43) of the housing (12), as well as with an electric motor (18) arranged in a second housing part (16) of the housing (12) to operate the compressor impeller (30), characterized in that a flow channel (42) running in the circumferential direction of the first housing part (12) and connecting the compression area (28) with the air outlet (43) surrounds the electric motor (18) at least partially in the axial direction, characterized in that the flow channel (42) is connectable with the air inlet (24) of the housing (12) by means (64, 68, 70) via a bypass channel (62) bypassing the compressor impeller (30), and characterized in that elastic means (70) are provided to open the bypass channel (62) with a deactivated electric motor (18).

2. The Device according to claim 1, characterized in that the flow channel (42) is connected with the electric motor (18).

3. The Device according to claim 2, characterized in that the second housing part (16) is comprised at least partially of a heat conducting material.

4. The Device according to claim 3, characterized in that the second housing part (16) features a diffuser ring (19), which forms a portion of the limitation of the flow channel (42) and is thermally coupled to the electric motor (18).

5. The Device according to claim 1, characterized in that the flow channel (42) is essentially embodied in the second housing part (16).

6. The Device according to claim 5, characterized in that the flow channel (42) is embodied as a single piece with the second housing part.

7. The Device according to claim 1, characterized in that the flow channel (42) is arranged at the high-pressure side of the compressor impeller (30).

8. The Device according to claim 7, characterized in that the flow channel (42) is arranged on the side of the compressor impeller (30) facing away from the air inlet (24).

9. The Device according to claim 1, characterized in that the flow channel (42) features an essentially elliptical cross-section, whereby the large semiaxis of the ellipse runs essentially parallel to the drive shaft (46) of the electric motor (18).

10. The Device according to claim 1, characterized in that means (64, 68) are provided to close the bypass channel (62) with an activated electric motor (18).

11. The Device according to claim 10, characterized in that the means (64, 68) are self-setting.

12. The Device according to claim 11, characterized in that the means (64, 68) are air driven.

13. The Device according to claim 10, characterized in that the means (64, 68) are air driven.

14. The Device according to claim 1, characterized in that the second housing part (16) is comprised at least partially of a heat conducting material.

15. A device to compress combustion air for a combustion engine of a motor vehicle, with a housing (12), with at least one compressor impeller (30) arranged in a compression area (28) of a first housing part (14), which is arranged in the flow direction between an air inlet (24) and an air outlet (43) of the housing (12), as well as with an electric motor (18) arranged in a second housing part (16) of the housing (12) to operate the compressor impeller (30), wherein a spiral-shaped flow channel (42) running in the circumferential direction of the first housing part (12) and connecting the compression area (28) with the air outlet (43) surrounds the electric motor (18) at least partially in the axial direction, wherein the flow channel (42) is a least partially defined by the second housing part (16) and has a cross-section that widens in the circumferential direction of the housing (12), so that air flows circumferentially from the compression area (28) to the air outlet (43), and characterized in that electronic components (54) of the motor electronics of the driving electric motor (18) are mounted on the second housing part (16) such that the second housing part conducts heat from the electronic components to the flow channel so that the electronic components are cooled predominantly via the flow channel (42), characterized in that the flow channel (42) is connectable with the air inlet (24) of the housing (12) by means (64, 68, 70) via a bypass channel (62) bypassing the compressor impeller (30), and characterized in that elastic means (70) are provided to open the bypass channel (62) with a deactivated electric motor (18).

* * * * *